(12) United States Patent
Hsiao et al.

(10) Patent No.: US 10,008,573 B1
(45) Date of Patent: Jun. 26, 2018

(54) HIGH-VOLTAGE METAL-OXIDE-SEMICONDUCTOR TRANSISTOR DEVICE

(71) Applicant: UNITED MICROELECTRONICS CORP., Hsin-Chu (TW)

(72) Inventors: Shih-Yin Hsiao, Chiayi County (TW); Hsuan-Kai Chen, Taichung (TW); Tun-Jen Cheng, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/450,030

(22) Filed: Mar. 6, 2017

(30) Foreign Application Priority Data

Feb. 3, 2017 (CN) .......................... 2017 1 0063728

(51) Int. Cl.
*H01L 29/66* (2006.01)
*H01L 29/40* (2006.01)
*H01L 29/78* (2006.01)
*H01L 29/10* (2006.01)

(52) U.S. Cl.
CPC ........ *H01L 29/404* (2013.01); *H01L 29/1095* (2013.01); *H01L 29/408* (2013.01); *H01L 29/7816* (2013.01)

(58) Field of Classification Search
CPC . H01L 29/404; H01L 29/408; H01L 29/7816; H01L 29/1095

USPC ......................................................... 257/339
See application file for complete search history.

(56) References Cited

U.S. PATENT DOCUMENTS

| 5,899,742 A * | 5/1999 | Sun | .................... H01L 21/76895 |
| | | | 148/DIG. 19 |
| 8,790,966 B2 * | 7/2014 | Zhang | .................... H01L 29/402 |
| | | | 257/367 |
| 8,803,234 B1 * | 8/2014 | Liao | .................... H01L 29/7833 |
| | | | 257/335 |
| 9,391,196 B1 | 7/2016 | Chang | |

* cited by examiner

*Primary Examiner* — Vu A Vu
(74) *Attorney, Agent, or Firm* — Winston Hsu

(57) ABSTRACT

A high-voltage metal-oxide-semiconductor transistor device includes a semiconductor substrate, a gate structure, a first drift region, a first isolation structure, a drain region, and a first sub-gate structure. The gate structure and the first sub-gate structure are disposed on the semiconductor substrate and separated from each other. The first drift region is disposed in the semiconductor substrate and disposed at one side of the gate structure. The first isolation structure and the drain region are disposed in the first drift region and separated from each other. A part of the first drift region is disposed between the drain region and the first isolation structure. The first sub-gate structure is at least partially disposed on the first drift region disposed between the drain region and the first isolation structure, and the first sub-gate structure is electrically connected to the drain region.

19 Claims, 7 Drawing Sheets

HIGH-VOLTAGE METAL-OXIDE-SEMICONDUCTOR TRANSISTOR DEVICE

BACKGROUND OF THE INVENTION

1. Field of the Invention

The present invention relates to a high-voltage metal-oxide-semiconductor (HV MOS) transistor device, and more particularly, to a HV MOS transistor device including a sub-gate structure.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency (HF) band power amplifier.

The essential feature of LDMOS transistor device is a lateral-diffused drift region with low doping concentration and large area. The drift region is used to alleviate the high voltage between the drain and the source, and therefore LDMOS transistor device can have higher breakdown voltage. However, in the conventional LDMOS transistor device, Kirk-effect and high substrate current ($I_{sub}$) are problems still when the gate voltage becomes too high, the device will be burned out under operations at higher voltage, and the demands for high voltage operations cannot be realized accordingly.

SUMMARY OF THE INVENTION

It is one of the objectives of the present invention to provide a high-voltage metal-oxide-semiconductor (HV MOS) transistor device. A sub-gate structure electrically connected to a drain region is disposed between the drain region and a gate structure, and the sub-gate structure is at least partially disposed between a part of a first drift region disposed between the drain region and a first isolation structure for improving the Kirk-effect problem.

A high-voltage metal-oxide-semiconductor (HV MOS) transistor device is provided in an embodiment of the present invention. The HV MOS transistor device includes a semiconductor substrate, a gate structure, a first drift region, a first isolation structure, a drain region, and a first sub-gate structure. The gate structure and the first sub-gate structure are disposed on the semiconductor substrate. The first sub-gate structure is separated from the gate structure. The first drift region is disposed in the semiconductor substrate and disposed at one side of the gate structure. The first isolation structure and a drain region are disposed in the first drift region. The drain region is separated from the first isolation structure, and a part of the first drift region is disposed between the drain region and the first isolation structure. The first sub-gate structure is at least partially disposed on the part of the first drift region disposed between the drain region and the first isolation structure, and the first sub-gate structure is electrically connected to the drain region.

According to the HV MOS transistor device in the present invention, the sub-gate structure at least partially disposed on the part of the first drift region disposed between the drain region and the first isolation structure may be used to lower the current injected into the depletion region during high voltage operations. The Kirk-effect problem may be improved and operations at higher voltage may be realized accordingly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
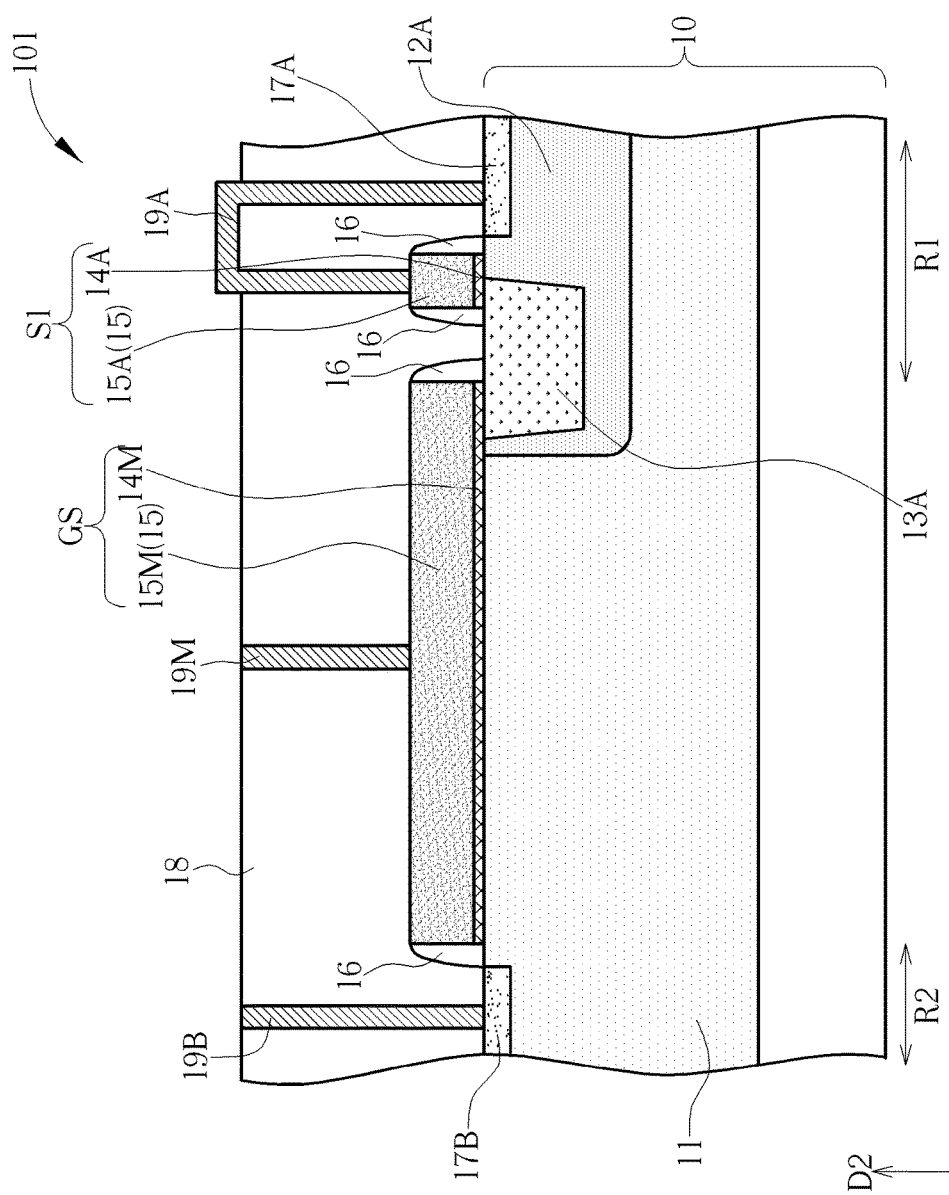
FIG. 1 is a schematic drawing illustrating a high-voltage metal-oxide-semiconductor (HV MOS) transistor device according to a first embodiment of the present invention.

Please refer to FIG. 1. FIG. 1 is a schematic drawing illustrating a high-voltage metal-oxide-semiconductor (HV MOS) transistor device according to a first embodiment of the present invention. As shown in FIG. 1, a HV MOS transistor device 101 is provided in this embodiment. The HV MOS transistor device 101 includes a semiconductor substrate 10, a gate structure GS, a first drift region 12A, a first isolation structure 13A, a drain region 17A, and a first sub-gate structure S1. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. Additionally, a well 11 such as an N-type well or a P-type well may be formed in the semiconductor substrate 10. The gate structure GS and the first sub-gate structure S1 are disposed on the semiconductor substrate 10. The first sub-gate structure S1 is separated from the gate structure GS. The gate structure GS may include a first conductive part 15M, and the first sub-gate structure S1 may include a second conductive part 15A. The first conductive part 15M and the second conductive part 15A may be formed by patterning a conductive layer 15, and the conductive layer 15 may include polysilicon, metal conductive materials, or other suitable conductive materials, but not limited thereto. In some embodiments, the first conductive part 15M and the second conductive part 15A may be formed by different materials respectively and/or be formed by filling recesses with multiple layers of conductive materials. The recesses may be formed by dummy gates in a process such as a replacement metal gate (RMG) process, and the first conductive part 15M and the second conductive part 15A may include U-shaped stacked conductive material layers in a cross-sectional view, but not limited thereto. The first drift region 12A is disposed in the semiconductor substrate 10 and the first drift region 12A is disposed at one side of the gate structure GS. Specifically, the semiconductor substrate 10 may have a first region R1 and a second region R2 respectively disposed at two opposite sides of the gate structure GS in a horizontal first direction D1. An edge of the first region R1 maybe aligned with a side of the gate structure GS, an edge of the second region R2 may be aligned with an opposite side of the gate structure GS in the first direction D1, and the first drift region is at least partially disposed in the first region R1. In some embodiments, the first drift region 12A may extend towards the gate structure GS for being partially disposed under the gate structure GS in a second direction D2 perpendicular to the semiconductor substrate 10, but not limited thereto.

The first drift region 12A may be formed in the semiconductor substrate 10 by a doping process such as an implantation process. In some embodiments, the well 11 in the semiconductor substrate 10 may have a first conductivity type, the first drift region 12A may have a second conductivity type, and the first conductivity type is complementary to the second conductivity type. For example, in this embodiment, the first conductivity type may be P-type and the second conductivity type may be N-type, but not limited thereto. In other words, the well 11 may be a P-type well, and the first drift region 12A may be an N-type drift region, but not limited thereto. In some embodiments, the well 11 mentioned above will not be required when a semiconductor substrate 10 having the first conductivity type is applied.

The first isolation structure 13A and a drain region 17A are disposed in the first drift region 12A. The drain region 17A is separated from the first isolation structure 13A, and a part of the first drift region 12A is disposed between the drain region 17A and the first isolation structure 13A. In some embodiments, the drain region 17A may include a second conductivity type region such as an N-type doped region when the well 11 is a first conductivity type well and the first drift region 12A is a second conductivity type drift region, but not limited thereto. The first isolation structure 13A may include a shallow trench isolation, a field oxide, or other suitable insulation materials formed in the first drift region 12A. In other words, the first isolation structure 13A and the drain region 17A are disposed in the first region R1 of the semiconductor substrate 10, and the first isolation structure 13A in some embodiments may extend towards the gate structure GS for being partially disposed under the gate structure GS in the second direction D2, but not limited thereto. Additionally, the first sub-gate structure S1 is at least partially disposed on the part of the first drift region 12A disposed between the drain region 17A and the first isolation structure 13A, and the first sub-gate structure S1 is electrically connected to the drain region 17A. In some embodiments, the first sub-gate structure S1 may be further disposed on the first isolation structure 13A, and the first sub-gate structure S1 may be partly disposed on the first isolation structure 13A and partly disposed on the part of the first drift region 12A disposed between the drain region 17A and the first isolation structure 13A.

As shown in FIG. 1, the gate structure GS may further include a first gate insulation layer 14M, and the first sub-gate structure S1 may further include a second gate insulation layer 14A. The first gate insulation layer 14M is disposed between the first conductive part 15M and the semiconductor substrate 10, and the second gate insulation layer 14A is disposed between the second conductive part 15A and the semiconductor substrate 10. The first gate insulation layer 14M and the second gate insulation layer 14A may include oxide dielectric layers or other suitable materials. In some embodiments, the first gate insulation layer 14M and the second gate insulation layer 14A may be formed by the same material and formed by the same process simultaneously, but not limited thereto. In some embodiments, the first gate insulation layer 14M and the second gate insulation layer 14A may also be formed by different materials and/or different processes respectively according to other considerations. Additionally, the HV MOS transistor device 101 may further include a first contact structure 19A disposed on the first sub-gate structure S1 and the drain region 17A. The drain region 17A is electrically connected to the first sub-gate structure S1 via the first contact structure 19A. For example, in some embodiments, the HV MOS transistor device 101 may further include a dielectric layer 18 disposed on the gate structure GS, the first sub-gate structure S1, and the drain region 17A. The first contact structure 19A may penetrate the dielectric layer 18 on the first sub-gate structure S1 and the drain region 17A for being electrically connected with the first sub-gate structure S1 and the drain region 17A, but not limited thereto. In some embodiments, the first sub-gate structure S1 and the drain region 17A may also be electrically connected with each other by other suitable approaches and/or connection parts.

In addition, as shown in FIG. 1, the HV MOS transistor device 101 may further include a sidewall spacer 16, a source region 17B, a second contact structure 19B, and a gate contact structure 19M. The sidewall spacer 16 is disposed on sidewalls of the gate structure GS and the first sub-gate structure S1, and a part of the sidewall spacer 16 is disposed between the gate structure GS and the first sub-gate structure S1. The source region 17B is disposed in the second region R2 of the semiconductor substrate 10. In some embodiments, the source region 17B may include a second conductivity type region such as an N-type doped region when the well 11 is a first conductivity type well, but not limited thereto. Additionally, the second contact structure 19B may penetrate the dielectric layer 18 for being electrically connected with the source region 17B, and the gate contact structure 19M may penetrate the dielectric layer 18 for being electrically connected with the gate structure GS. The first contact structure 19A, the second contact structure 19B, and the gate contact structure 19M may be formed simultaneously by one identical process, but not limited thereto.

In this embodiment, an electric potential of the first sub-gate structure S1 is equal to an electric potential of the drain region 17A because the first sub-gate structure S1 is electrically connected with the drain region 17A, and the first sub-gate structure S1 is at least partially disposed on the part of the first drift region 12A disposed between the drain region 17A and the first isolation structure 13A. The first sub-gate structure S1 may be used to lower electrical current injected into the depletion region of the HV MOS transistor device 101 during high voltage operations for improving the Kirk-effect issue. Additionally, the dopant concentration of the first drift region 12A does not have to be increased for improving the Kirk-effect issue because of the disposition of the first sub-gate structure S1, and the vertical punchthrough issue between the drain region 17A and the substrate 10 may be avoided accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 2:
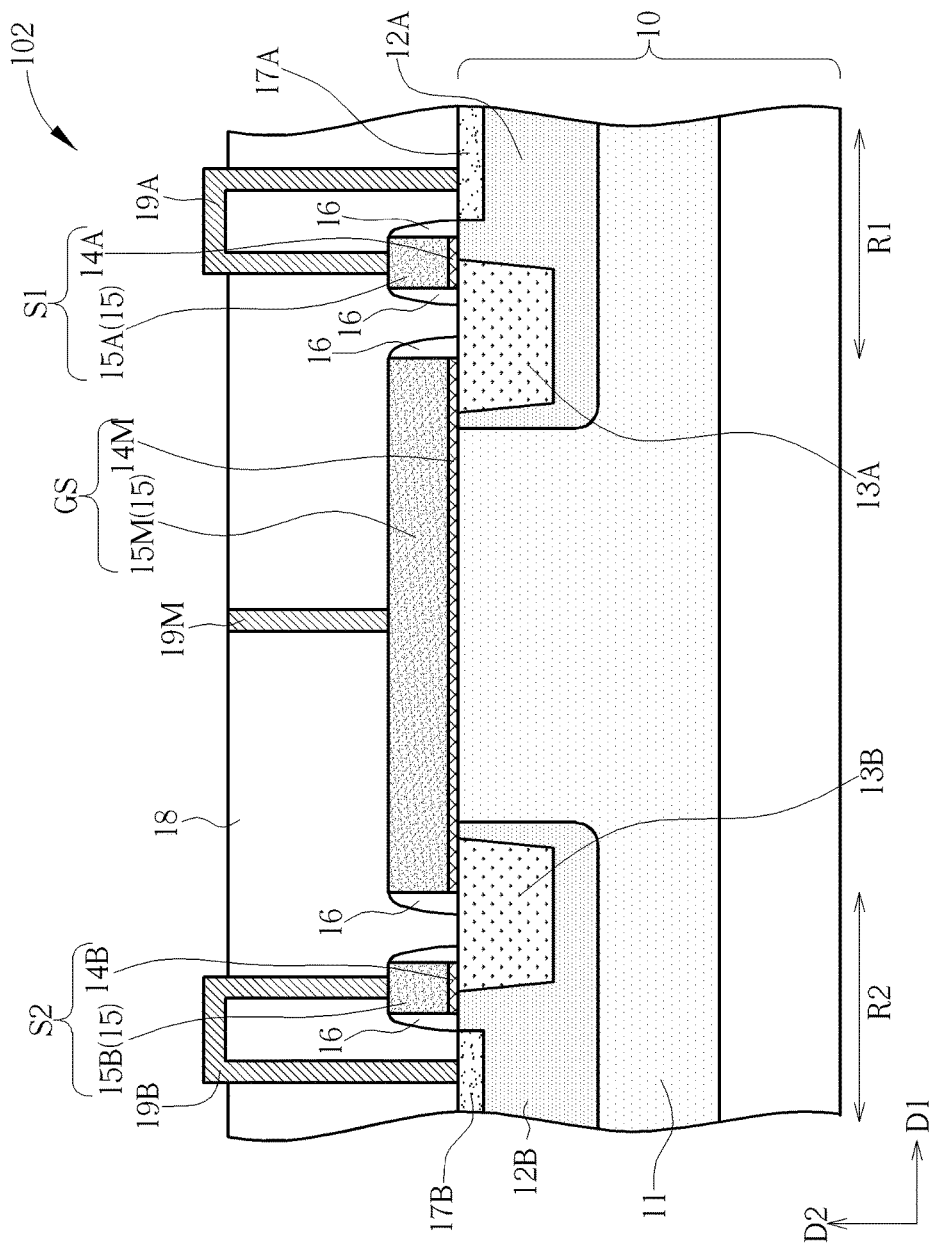
FIG. 2 is a schematic drawing illustrating a HV MOS transistor device according to a second embodiment of the present invention.

Please refer to FIG. 2. FIG. 2 is a schematic drawing illustrating a HV MOS transistor device 102 according to a second embodiment of the present invention. As shown in FIG. 2, the difference between the HV MOS transistor device 102 in this embodiment and the HV MOS transistor device in the first embodiment mentioned above is that the HV MOS transistor device 102 may further include a second drift region 12B and a second isolation structure 13B. The second drift region 12B is disposed in the semiconductor substrate. The second drift region 12B and the first drift region 12A are disposed at two opposite sides of the gate structure GS respectively. In other words, the second drift region 12B is at least partially disposed in the second region R2. In some embodiments, the second drift region 12B may extend towards the gate structure GS for being partially disposed under the gate structure GS in the second direction D2, but not limited thereto. The material and the manufacturing method of the second drift region 12B may be similar to those of the first drift region 12A described above, but not limited thereto. In some embodiments, the second drift region 12B and the first drift region 12A may also be formed by different materials and/or different manufacturing methods respectively according to other considerations.

In the HV MOS transistor device 102, the source region 17B and the second isolation structure 13B are disposed in the second drift region 12B. The source region 17B is separated from the second isolation structure 13B, and a part of the second drift region 12B is disposed between the source region 17B and the second isolation structure 13B. The material and the manufacturing method of the second isolation structure 13B maybe similar to those of the first isolation structure 13A described above, but not limited thereto. In some embodiments, the first isolation structure 13A and the second isolation structure 13B may also be formed by different materials and/or different manufacturing methods respectively according to other considerations. Additionally, the second isolation structure 13B and the source region 17B are disposed in the second region R2 of the semiconductor substrate 10, and in some embodiments, the second isolation structure 13B may extend towards the gate structure GS for being partially disposed under the gate structure GS in the second direction D2, but not limited thereto.

Additionally, the HV MOS transistor device 102 may further include a second sub-gate structure S2 disposed on the semiconductor substrate 10. The second sub-gate structure S2 is separated from the gate structure GS. The second sub-gate structure S2 is at least partially disposed on the part of the second drift region 12B disposed between the source region 17B and the second isolation structure 13B, and the second sub-gate structure S2 is electrically connected to the source region 17B. In some embodiments, the second sub-gate structure S2 maybe further disposed on the second isolation structure 13B, and the second sub-gate structure S2 may be partly disposed on the second isolation structure 13B and partly disposed on the part of the second drift region 12B disposed between the source region 17B and the second isolation structure 13B.

As shown in FIG. 2, the second sub-gate structure S2 may include a third conductive part 15B and a third gate insulation layer 14B. The third gate insulation layer 14B is disposed between the third conductive part 15B and the semiconductor substrate 10. The materials and the manufacturing methods of the third conductive part 15B and the third gate insulation layer 14B of the second sub-gate structure S2 may be similar to those of the second conductive part 15A and the second gate insulation layer 14A of the first sub-gate structure S1 described above, but not limited thereto. In some embodiments, the second sub-gate structure S2 and the first sub-gate structure S1 may also be formed by different materials and/or different manufacturing methods according to other considerations. Additionally, in some embodiments, the second contact structure 19B maybe disposed on the second sub-gate structure S2 and the source region 17B, and the source region 17B may be electrically connected to the second sub-gate structure S2 via the second contact structure 19B. In other words, the dielectric layer 18 maybe further disposed on the second sub-gate structure S2, and the second contact structure 19B may penetrate the dielectric layer 18 on the second sub-gate structure S2 and the source region 17B for being electrically connected with the second sub-gate structure S2 and the source region 17B, but not limited thereto. In some embodiments, the second sub-gate structure S2 and the source region 17B may also be electrically connected with each other by other suitable approaches and/or connection parts.

Figure 3:
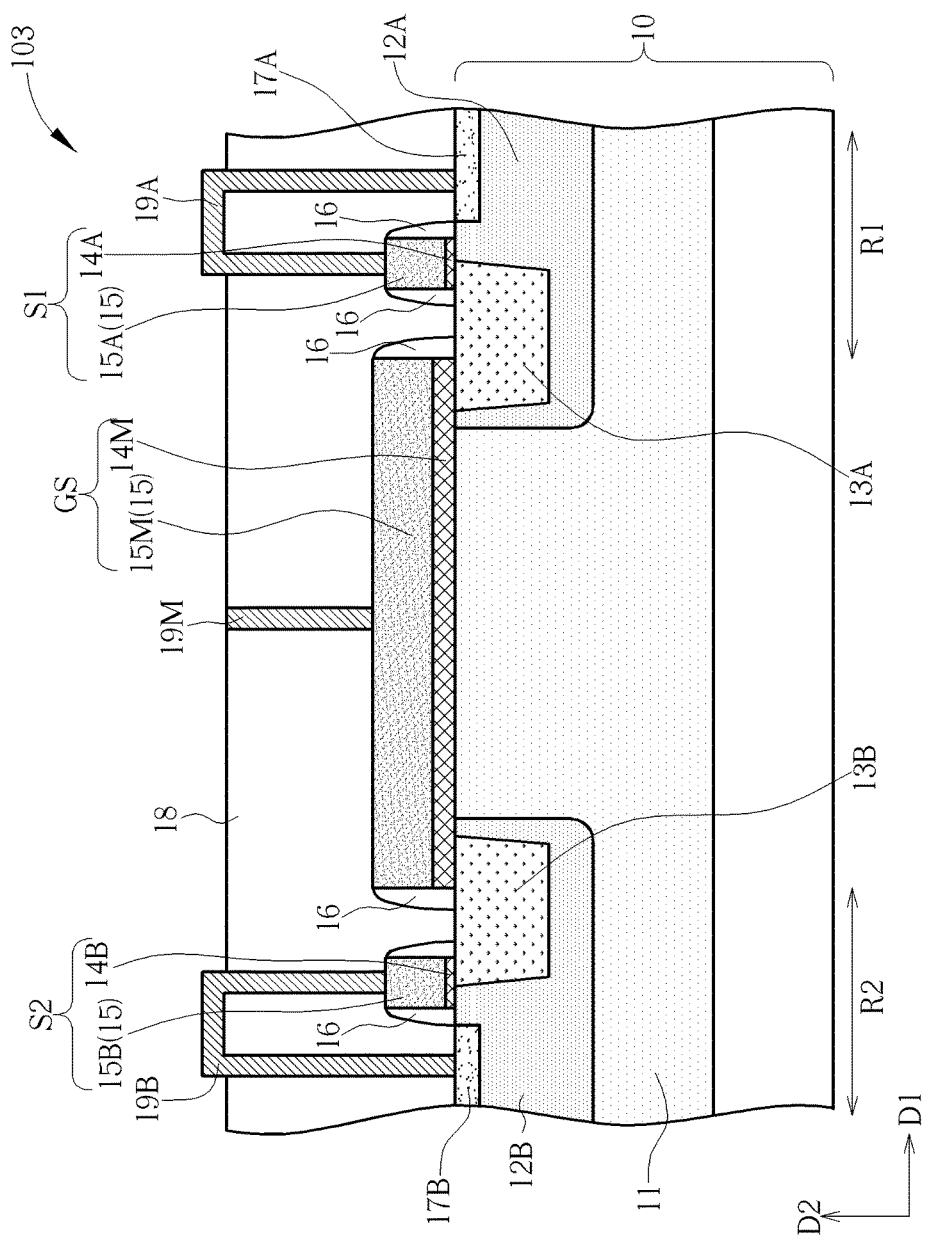
FIG. 3 is a schematic drawing illustrating a HV MOS transistor device according to a third embodiment of the present invention.

Please refer to FIG. 3. FIG. 3 is a schematic drawing illustrating a HV MOS transistor device 103 according to a third embodiment of the present invention. As shown in FIG. 3, the difference between the HV MOS transistor device 103 in this embodiment and the HV MOS transistor device in the second embodiment mentioned above is that the first gate insulation layer 14M in this embodiment is thicker than the second gate insulation layer 14A and the third gate insulation layer 14B for requirements of operations at higher voltage. In some embodiments, the first gate insulation layer 14M, the second gate insulation layer 14A, and the third gate insulation layer 14B may be formed by patterning one identical dielectric layer still, and an etching back process performed locally on some regions may be used to formed the first gate insulation layer 14M, the second gate insulation layer 14A, and the third gate insulation layer 14B with different thicknesses, but not limited thereto. In some embodiments, the first gate insulation layer 14M, the second gate insulation layer 14A, and the third gate insulation layer 14B may also be formed by different materials and/or different manufacturing methods according to other considerations.

Figure 4:
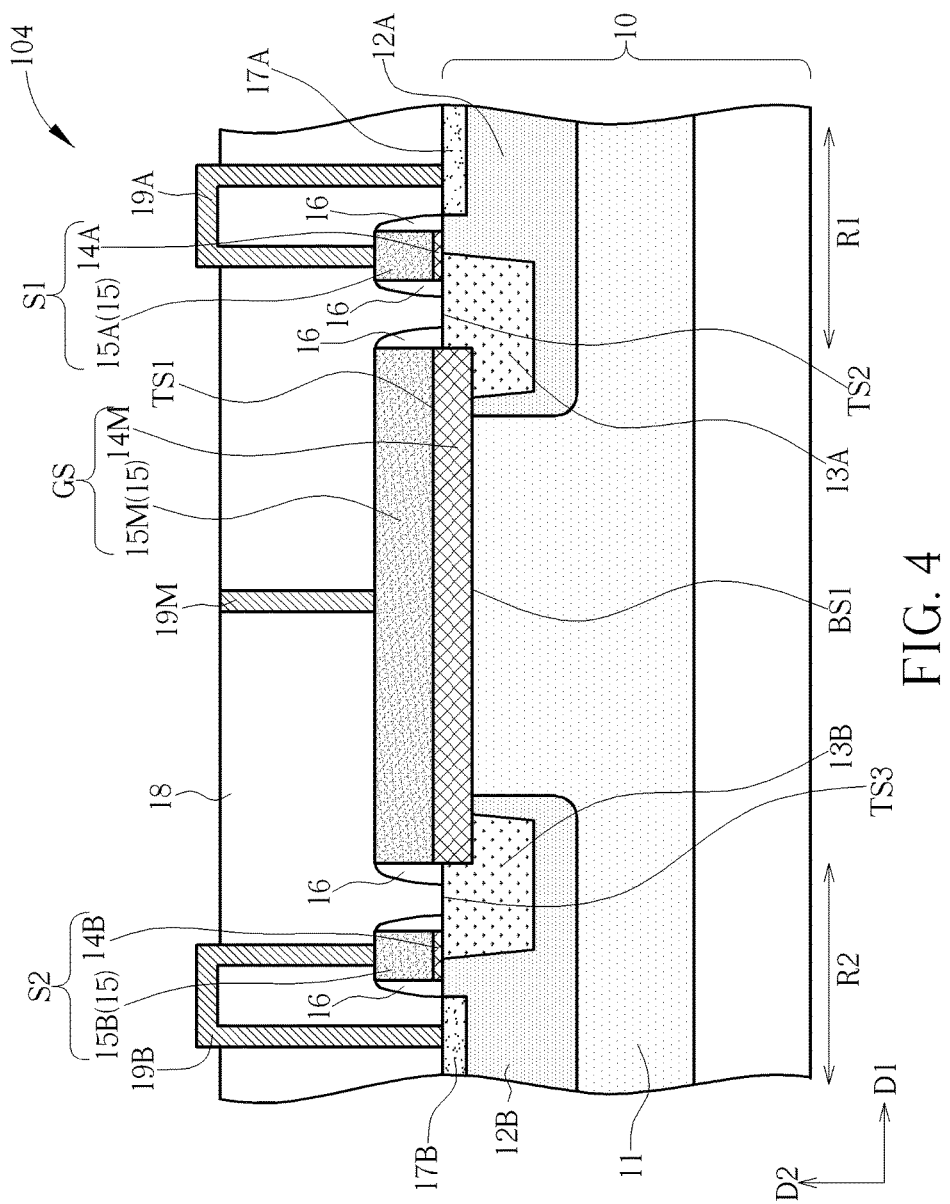
FIG. 4 is a schematic drawing illustrating a HV MOS transistor device according to a fourth embodiment of the present invention.

Please refer to FIG. 4. FIG. 4 is a schematic drawing illustrating a HV MOS transistor device 104 according to a fourth embodiment of the present invention. As shown in FIG. 4, the difference between the HV MOS transistor device 104 in this embodiment and the HV MOS transistor device in the third embodiment mentioned above is that a bottom surface (such as a first bottom surface BS1 shown in FIG. 4) of the first gate insulation layer 14M is lower than a topmost surface (such as a second topmost surface TS2 shown in FIG. 4) of the first isolation structure 13A in the second direction D2. In other words, the manufacturing method of the first gate insulation layer 14M may include forming a recess in the semiconductor substrate 10 and forming a dielectric layer in the recess for forming the thicker first gate insulation layer 14M. By the method described above, the height difference between the HV MOS transistor device and other semiconductor devices) disposed on the same semiconductor substrate (such as low voltage semiconductor device in the logic region, not shown may be reduced when the first gate insulation layer 14M has to become thicker for electrical requirements. Related manufacturing problems may be avoided and the manufacturing yield may be enhanced accordingly. Additionally, a topmost surface (such as a first topmost surface TS1 shown in FIG. 4) of the first gate insulation layer 14M may be higher than the second topmost surface TS2 of the first isolation structure 13A in the second direction D2 for avoiding obvious height differences between the first conductive part 15M, the first sub-gate structure S1, the second sub-gate structure S2, and/or other semiconductor devices when the position of the first gate insulation layer 14M is too low, but not limited thereto.

Figure 5:
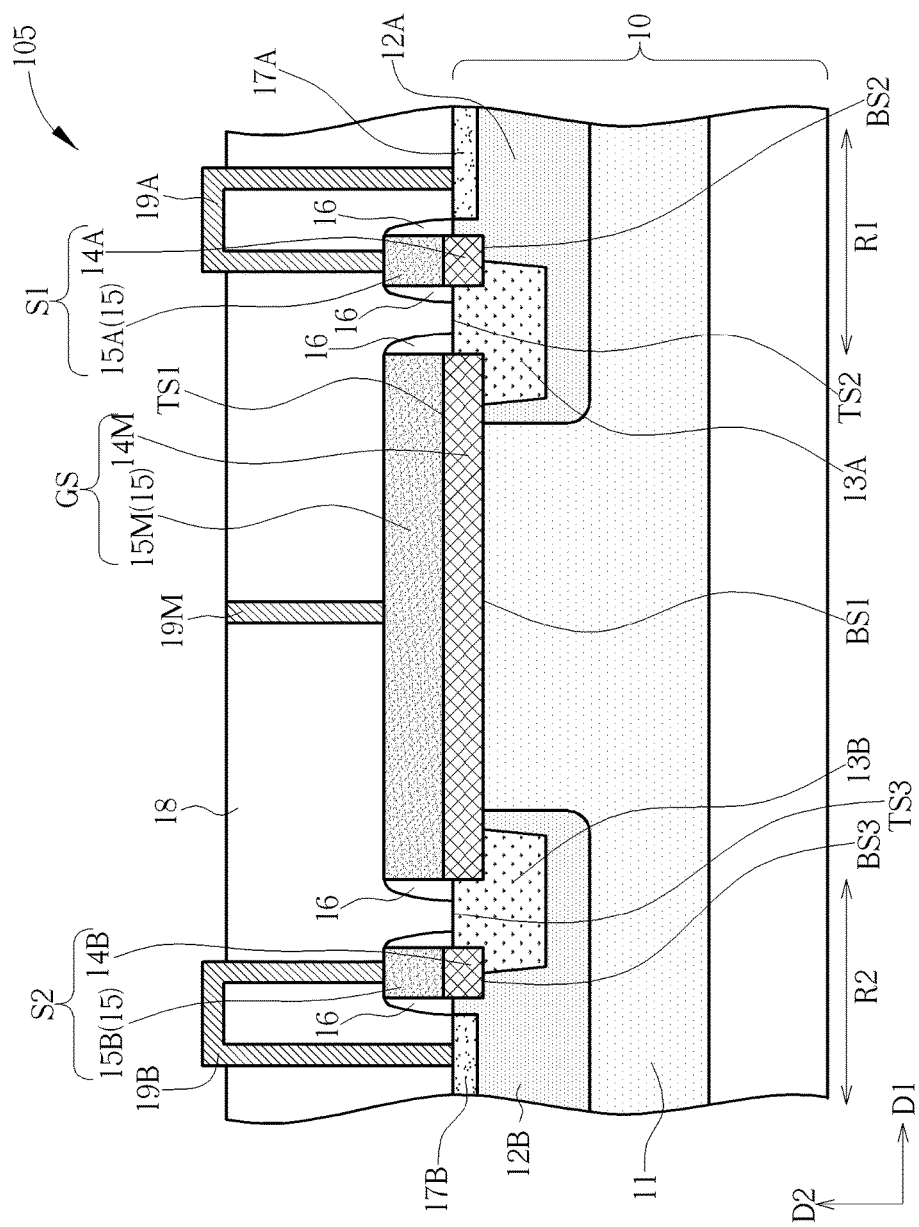
FIG. 5 is a schematic drawing illustrating a HV MOS transistor device according to a fifth embodiment of the present invention.

Please refer to FIG. 5. FIG. 5 is a schematic drawing illustrating a HV MOS transistor device 105 according to a fifth embodiment of the present invention. As shown in FIG. 5, the difference between the HV MOS transistor device 105 in this embodiment and the HV MOS transistor device in the fourth embodiment mentioned above is that a bottom surface (such as a second bottom surface BS2 shown in FIG. 5) of the second gate insulation layer 14A is lower than the second topmost surface TS2 of the first isolation structure 13A in the second direction D2. Additionally, a bottom surface (such as a third bottom surface BS3 shown in FIG. 5) of the third gate insulation layer 14B may also be lower than a topmost surface (such as a third topmost surface TS3 shown in FIG. 5) of the second isolation structure 13B in the second direction D2. In other words, the manufacturing method of the second gate insulation layer 14A and the third gate insulation layer 14B may be similar to the manufacturing method of the first gate insulation layer 14M described in the fourth embodiment mentioned above. Recesses may be formed in the semiconductor substrate 10, and dielectric layers may be formed in the recesses for forming the second gate insulation layer 14A and the third gate insulation layer 14B. By the method described above, the second gate insulation layer 14A and the third gate insulation layer 14B may become thicker for further improving the Kirk-effect issue without increasing the heights of the first sub-gate structure S1 and the second sub-gate structure S2.

Figure 6:
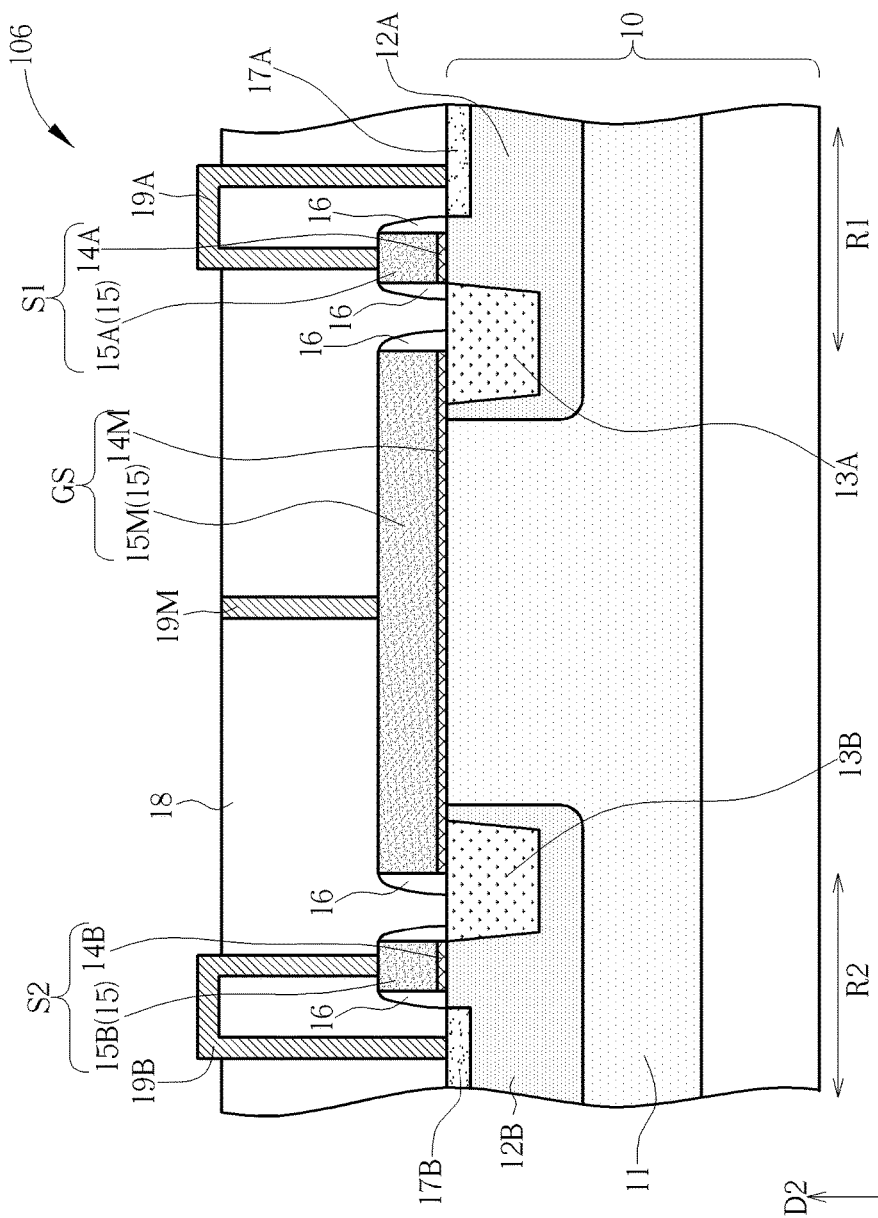
FIG. 6 is a schematic drawing illustrating a HV MOS transistor device according to a sixth embodiment of the present invention.

Please refer to FIG. 6. FIG. 6 is a schematic drawing illustrating a HV MOS transistor device 106 according to a sixth embodiment of the present invention. As shown in FIG. 6, the difference between the HV MOS transistor device 106 in this embodiment and the HV MOS transistor device in the second embodiment mentioned above is that the first sub-gate structure S1 in this embodiment is disposed only on the part of the first drift region 12A disposed between the drain region 17A and the first isolation structure 13A. In other words, the first sub-gate structure S1 may be not disposed on the first isolation structure 13A. In addition, the second sub-gate structure S2 may be disposed only on the part of the second drift region 12B disposed between the source region 17B and the second isolation structure 13B. In other words, the second sub-gate structure S2 may be not disposed on the second isolation structure 13B. It is worth noting that the allocations of the first sub-gate structure S1 and the second sub-gate structure S2 in this embodiment may be applied to the embodiments mentioned above and/or other embodiments of the present invention.

Figure 7:
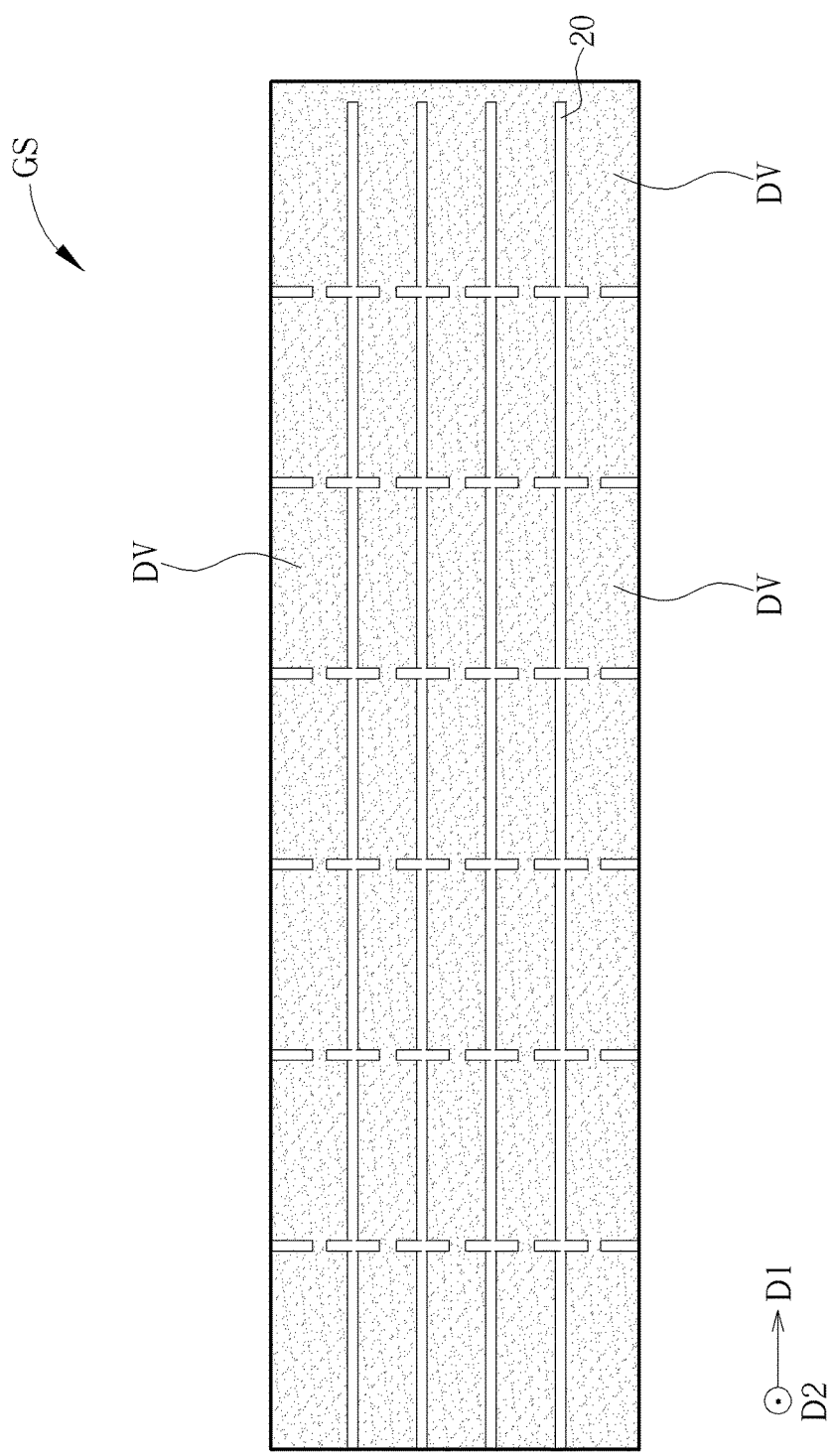
FIG. 7 is a schematic drawing illustrating a gate structure of a HV MOS transistor device according to an embodiment of the present invention.

Please refer to FIG. 7. FIG. 7 is a schematic drawing illustrating a gate structure of a HV MOS transistor device according to an embodiment of the present invention. As shown in FIG. 7, the HV MOS transistor device in this embodiment may further include a gate separation structure 20 disposed in the gate structure GS, and the gate structure GS is divided into a plurality of divisions DV connected with one another by the gate separation structure 20. The gate structure GS is divided into the divisions DV by the gate separation structure 20, and each of the divisions DV has a relatively smaller area for avoiding a dishing issue occurring in a chemical mechanical polishing (CMP) process when the gate structure GS is a metal gate structure with a relatively larger area. The manufacturing yield of the HV MOS transistor device may be enhanced and the dimension limitation of the metal gate structure may be loosened accordingly. In addition, the gate structure GS and the gate separation structure 20 in this embodiment may be applied to the embodiments mentioned above and/or other embodiments of the present invention, and the gate separation structure 20 is not limited to be used when the gate structure GS is a metal gate.

To summarize the above descriptions, according to the HV MOS transistor device in the present invention, the first sub-gate structure is disposed on the first drift region disposed between the drain region and the first isolation structure for lowering the electrical current injected into the depletion region of the HV MOS transistor device during high voltage operations. The Kirk-effect issue may be improved and operations at higher voltage may be realized accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-voltage metal-oxide-semiconductor (HV MOS) transistor device, comprising:
 a semiconductor substrate;
 a gate structure disposed on the semiconductor substrate;
 a first drift region disposed in the semiconductor substrate and disposed at one side of the gate structure;
 a first isolation structure disposed in the first drift region;
 a drain region disposed in the first drift region, wherein the drain region is separated from the first isolation structure, and a part of the first drift region is disposed between the drain region and the first isolation structure; and
 a first sub-gate structure disposed on the semiconductor substrate, wherein the first sub-gate structure is separated from the gate structure, the first sub-gate structure is at least partially disposed on the part of the first drift region disposed between the drain region and the first isolation structure, and the first sub-gate structure is electrically connected to the drain region, wherein the first sub-gate structure is further disposed on the first isolation structure, and the first sub-gate structure is partly disposed on the first isolation structure and partly disposed on the part of the first drift region disposed between the drain region and the first isolation structure.

2. The HV MOS transistor device according to claim 1, wherein the gate structure comprises a first conductive part and a first gate insulation layer, and the first gate insulation layer is disposed between the first conductive part and the semiconductor substrate, wherein the first sub-gate structure comprises a second conductive part and a second gate insulation layer, and the second gate insulation layer is disposed between the second conductive part and the semiconductor substrate.

3. The HV MOS transistor device according to claim 2, wherein the first gate insulation layer is thicker than the second gate insulation layer.

4. The HV MOS transistor device according to claim 2, wherein a bottom surface of the first gate insulation layer is lower than a topmost surface of the first isolation structure.

5. The HV MOS transistor device according to claim 4, wherein a topmost surface of the first gate insulation layer is higher than the topmost surface of the first isolation structure.

6. The HV MOS transistor device according to claim 4, wherein a bottom surface of the second gate insulation layer is lower than a topmost surface of the first isolation structure.

7. The HV MOS transistor device according to claim 1, further comprising:
a first contact structure disposed on the first sub-gate structure and the drain region, wherein the drain region is electrically connected to the first sub-gate structure via the first contact structure.

8. The HV MOS transistor device according to claim 7, further comprising:
a dielectric layer disposed on the gate structure, the first sub-gate structure, and the drain region, wherein the first contact structure penetrates the dielectric layer on the first sub-gate structure and the drain region for being electrically connected with the first sub-gate structure and the drain region.

9. The HV MOS transistor device according to claim 1, further comprising:
a second drift region disposed in the semiconductor substrate, wherein the second drift region and the first drift region are disposed at two opposite sides of the gate structure; and
a second isolation structure disposed in the second drift region.

10. The HV MOS transistor device according to claim 9, wherein the second drift region is partially disposed under the gate structure.

11. The HV MOS transistor device according to claim 9, wherein the second isolation structure is partially disposed under the gate structure.

12. The HV MOS transistor device according to claim 9, further comprising:

a source region disposed in the second drift region, wherein the source region is separated from the second isolation structure, and a part of the second drift region is disposed between the source region and the second isolation structure; and
a second sub-gate structure disposed on the semiconductor substrate, wherein the second sub-gate structure is separated from the gate structure, the second sub-gate structure is at least partially disposed on the part of the second drift region disposed between the source region and the second isolation structure, and the second sub-gate structure is electrically connected to the source region.

13. The HV MOS transistor device according to claim 12, wherein the second sub-gate structure is further disposed on the second isolation structure, and the second sub-gate structure is partly disposed on the second isolation structure and partly disposed on the part of the second drift region disposed between the source region and the second isolation structure.

14. The HV MOS transistor device according to claim 12, further comprising:
a second contact structure disposed on the second sub-gate structure and the source region, wherein the source region is electrically connected to the second sub-gate structure via the second contact structure.

15. The HV MOS transistor device according to claim 1, further comprising:
a gate separation structure disposed in the gate structure, wherein the gate structure is divided into a plurality of divisions connected with one another by the gate separation structure.

16. The HV MOS transistor device according to claim 1, wherein the first drift region is partially disposed under the gate structure.

17. The HV MOS transistor device according to claim 1, wherein the first isolation structure is partially disposed under the gate structure.

18. The HV MOS transistor device according to claim 1, further comprising:
a sidewall spacer disposed on sidewalls of the gate structure and the first sub-gate structure, wherein a part of the sidewall spacer is disposed between the gate structure and the first sub-gate structure.

19. The HV MOS transistor device according to claim 1, wherein an electric potential of the first sub-gate structure is equal to an electric potential of the drain region.

* * * * *